United States Patent
Yuan et al.

(10) Patent No.: US 9,400,863 B2
(45) Date of Patent: Jul. 26, 2016

(54) COLOR-INSENSITIVE RULES FOR ROUTING STRUCTURES

(71) Applicant: GLOBALFOUNDRIES Inc., Grand Cayman (KY)

(72) Inventors: Lei Yuan, Cupertino, CA (US); Soo Han Choi, Pleasanton, CA (US); Li Yang, San Jose, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/687,477

(22) Filed: Apr. 15, 2015

(65) Prior Publication Data

US 2015/0220676 A1 Aug. 6, 2015

Related U.S. Application Data

(62) Division of application No. 14/017,594, filed on Sep. 4, 2013, now Pat. No. 9,158,879.

(51) Int. Cl.
*G06F 17/50* (2006.01)

(52) U.S. Cl.
CPC .................. *G06F 17/5077* (2013.01)

(58) Field of Classification Search
USPC ........................................................ 716/130
See application file for complete search history.

(56) References Cited

U.S. PATENT DOCUMENTS

| | | | | |
|---|---|---|---|---|
| 8,701,071 B2* | 4/2014 | Kornachuk | ......... | G06F 17/5072 716/123 |
| 2005/0136582 A1* | 6/2005 | Aller | ................ | G06F 17/5068 438/197 |
| 2009/0280582 A1* | 11/2009 | Thijs | ................ | H01L 27/0248 438/14 |
| 2011/0282478 A1* | 11/2011 | Shen | ................ | G06F 17/5081 700/104 |
| 2013/0062771 A1* | 3/2013 | Kodama | ............ | H01L 21/0337 257/773 |
| 2013/0207199 A1* | 8/2013 | Becker | ................ | H01L 27/092 257/369 |
| 2013/0275937 A1* | 10/2013 | Joshi | ................ | G06F 17/5068 716/119 |
| 2014/0282345 A1* | 9/2014 | Yuan | ................ | G06F 17/5077 716/126 |

* cited by examiner

*Primary Examiner* — Mohammed Alam

(74) *Attorney, Agent, or Firm* — Ditthavong & Steiner, P.C.

(57) ABSTRACT

Methodologies and an apparatus enabling a generation of color undeterminable polygons in IC designs are disclosed. Embodiments include: determining a plurality of first routes extending horizontally in an IC design, each of the plurality of first routes being placed on one of a plurality of equally spaced vertical positions of the IC design; determining whether a second route overlaps one of the vertical positions of the plurality of equally spaced vertical positions; and selecting a design rule for the second route based on the determination of whether the second route overlaps.

14 Claims, 11 Drawing Sheets

400

COLOR-INSENSITIVE RULES FOR ROUTING STRUCTURES

CROSS-REFERENCE TO RELATED APPLICATION

This application is a Divisional of U.S. application Ser. No. 14/017,594, filed Sep. 4, 2013, the content of which is incorporated herein by reference in its entirety.

TECHNICAL FIELD

The present disclosure relates to a manufacture of semiconductor devices. The present disclosure is particularly applicable to improving a density of features (e.g., cell utilization) for the 10 nanometer (nm) technology node and beyond.

BACKGROUND

In a fabrication of semiconductor devices, methods frequently attempt to verify a manufacturability of an integrated circuit (IC) design using a designated color of polygons (e.g., metal routes). Such color indicates a decomposition of the polygon. For instance, in a self-aligned double patterning (SADP) process a color frequently indicates a mandrel or non-mandrel region. By way of example, mandrels are formed on a hardmask, spacers are formed on each side of each of the mandrels, and the mandrels are subsequently removed. Next, the spacers are used to prevent an etching of covered portions of the hardmask, resulting in mandrel recesses (e.g., portion of the hardmask previously covered by the mandrels) and non-mandrel recesses (e.g., portions of the hardmask previously between the mandrels). Finally, the mandrel and non-mandrel recesses are filled with a metal, resulting in mandrel and non-mandrel metal routes, respectively. As such, determining a color of some polygons, such as, for instance, off-grid structures, short arms of an odd jog route, and jogs may be difficult to determine, particularly during a routing step in IC designs utilizing SADP processes. Furthermore, use of such color indeterminable routes may cause color decomposition issues, resulting in unmanufacturable IC designs utilizing SADP process. As such, many traditional methods avoid using color indeterminable routes, thereby resulting in a lower density of features in IC designs and in resulting IC devices.

A need therefore exists for a methodology enabling a generating of color undeterminable polygons (e.g., off-grid routes) in IC designs and for an apparatus for performing the method, particularly in IC designs utilizing SADP processes.

SUMMARY

An aspect of the present disclosure is a method of enabling a generation of color undeterminable polygons in an IC design by, inter alia, selecting a design rule for a route based on whether the route overlaps one of a plurality of equally spaced vertical positions.

Another aspect of the present disclosure is an apparatus configured to enable generation of color undeterminable polygons in an IC design by, inter alia, selecting a design rule for a route based on whether the route overlaps one of a plurality of equally spaced vertical positions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a plurality of first routes extending horizontally in an IC design, each of the plurality of first routes being placed on one of a plurality of equally spaced vertical positions of the IC design; determining whether a second route overlaps one of the plurality of equally spaced vertical positions; and selecting a design rule for the second route based on the determination of whether the second route overlaps.

Aspects include: designating first and second sets of the plurality of first routes, wherein the selected design rule is selected from a plurality of design rules including a first design rule indicating a first separation distance between the second route and a route of the first set and a second separation distance between the second route and a route of the second set. Additional aspects include designating first and second sets of the equally spaced vertical positions, each vertical position of the first set of the equally spaced vertical positions being separated from another vertical position of the first set of the equally spaced vertical positions by a vertical position of the second set of the equally spaced vertical positions, wherein the designation of first and second sets of the plurality of first routes is based on the designation of the first and second sets of the equally spaced vertical positions. Further aspects include a method, wherein the plurality of design rules further includes a second design rule indicating a third separation distance between the second route and routes of the first set and the third separation distance between the second route and routes of the second set. Some aspects include a method, wherein the third separation distance is greater than or equal to the first separation distance and is greater than or equal to the second separation distance. Additional aspects include a method, wherein the second design rule is selected and the method further includes generating the second route based on the second design rule. Further aspects include designating the first and second sets of the plurality of first routes to be decomposed using mandrel and non-mandrel regions, respectively. Some aspects include a method, wherein the second route is designated to be decomposed using either the mandrel or the non-mandrel region.

Another aspect of the present disclosure is an apparatus including: a processor; and a memory including computer program code for a program, the memory and the computer program code configured to, with the processor, cause the apparatus to perform the following, determine a plurality of first routes extending horizontally in an IC design, each of the plurality of first routes being placed on one of a plurality of equally spaced vertical positions of the IC design; determine whether a second route overlaps a midpoint between two adjacent vertical positions of the plurality of equally spaced vertical positions; and select a design rule for the second route based on the determination of whether the second route overlaps.

Some aspects include an apparatus further caused to: designate first and second sets of the plurality of first routes, wherein the selected design rule is selected from a plurality of design rules including a first design rule indicating a first separation distance between the second route and a route of the first set and a second separation distance between the second route and a route of the second set. Additional aspects include an apparatus further caused to designate first and second sets of the equally spaced vertical positions, each vertical position of the first set of the equally spaced vertical positions being separated from another vertical position of the first set of the equally spaced vertical positions by a vertical position of the second set of the equally spaced vertical positions, wherein the designation of first and second sets of the plurality of first routes is based on the designation of the first and second sets of the equally spaced vertical positions. Further aspects include an apparatus, wherein the plurality of design rules further includes a second design rule indicating a third separation distance between the second route and routes of the first set and the third separation distance between the second route and routes of the second set. Some aspects include an apparatus, wherein the third separation distance is greater than or equal to the first separation distance and is greater than or equal to the second separation distance. Additional aspects include an apparatus, wherein the second design rule is selected and the apparatus is further caused to generate the second route based on the second design rule. Some aspects include an apparatus further caused to designate the first and second sets of the plurality of first routes to be decomposed using mandrel and non-mandrel regions, respectively. Further aspects include an apparatus, wherein the second route is designated to be decomposed using either the mandrel or the non-mandrel region.

Another aspect of the present disclosure is a method including: designating each of a plurality of first routes extending horizontally in an IC design positions as one of a plurality of colors, each of the plurality of first routes being placed on one of a plurality of equally spaced vertical positions of the IC design, wherein each of the first routes is generated according to a first design rule indicating a first separation distance between routes designated as different colors and a second separation distance between routes designated as same colors; designating a second route as color insensitive based on whether the second route overlaps, one of the vertical positions of the plurality of equally spaced vertical positions; and generating the second route according to a second design rule indicating a third separation distance between the second route and each route of the plurality of first routes without regard to a color designation.

Some aspects include designating first and second sets of the equally spaced vertical positions, each vertical position of the first set of the equally spaced vertical positions being separated from another vertical position of the first set of the equally spaced vertical positions by a vertical position of the second set of the equally spaced vertical positions, wherein the designation of each of the plurality of first routes is based on the designation of the first and second sets of the equally spaced vertical positions. Further aspects include a method, wherein the third separation distance is greater than or equal to the first separation distance and is greater than or equal to the second separation distance. Additional aspects include a method, wherein each of the plurality of first routes is designated as a first or second color, the method further including: designating routes of the first and second colors to be decomposable using mandrel and non-mandrel regions, respectively; and designating the second route to be decomposable using either the mandrel or the non-mandrel region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of enabling a generation of color undeterminable polygons in an IC design. In accordance with embodiments of the present disclosure, the problems are solved, for instance by, inter alia, selecting a design rule for a route based on whether the route overlaps one vertical position of a plurality of equally spaced vertical positions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
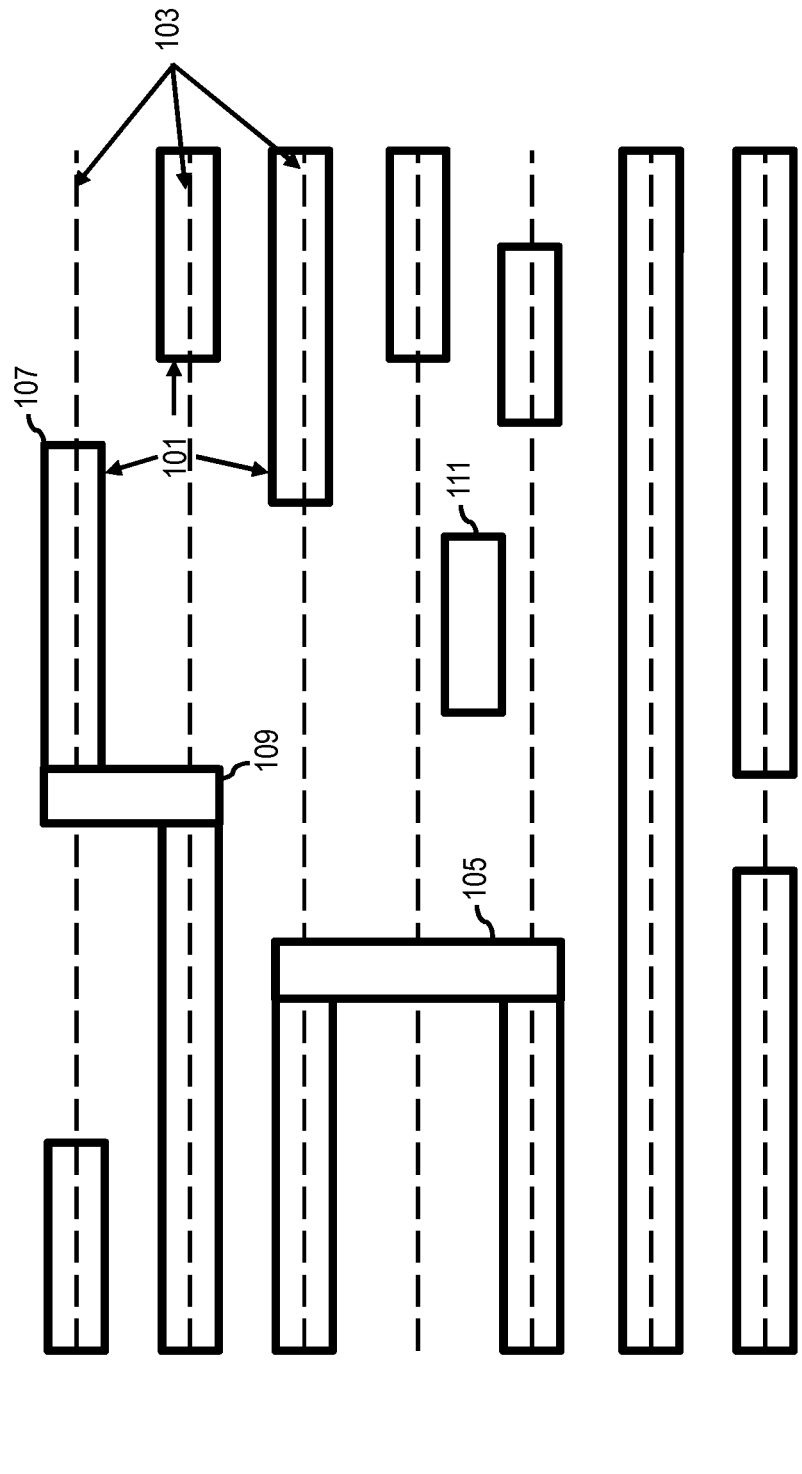
FIGS. 1 and 2 schematically illustrate a global coloring scheme, in accordance with an exemplary embodiment.
Figure 2:
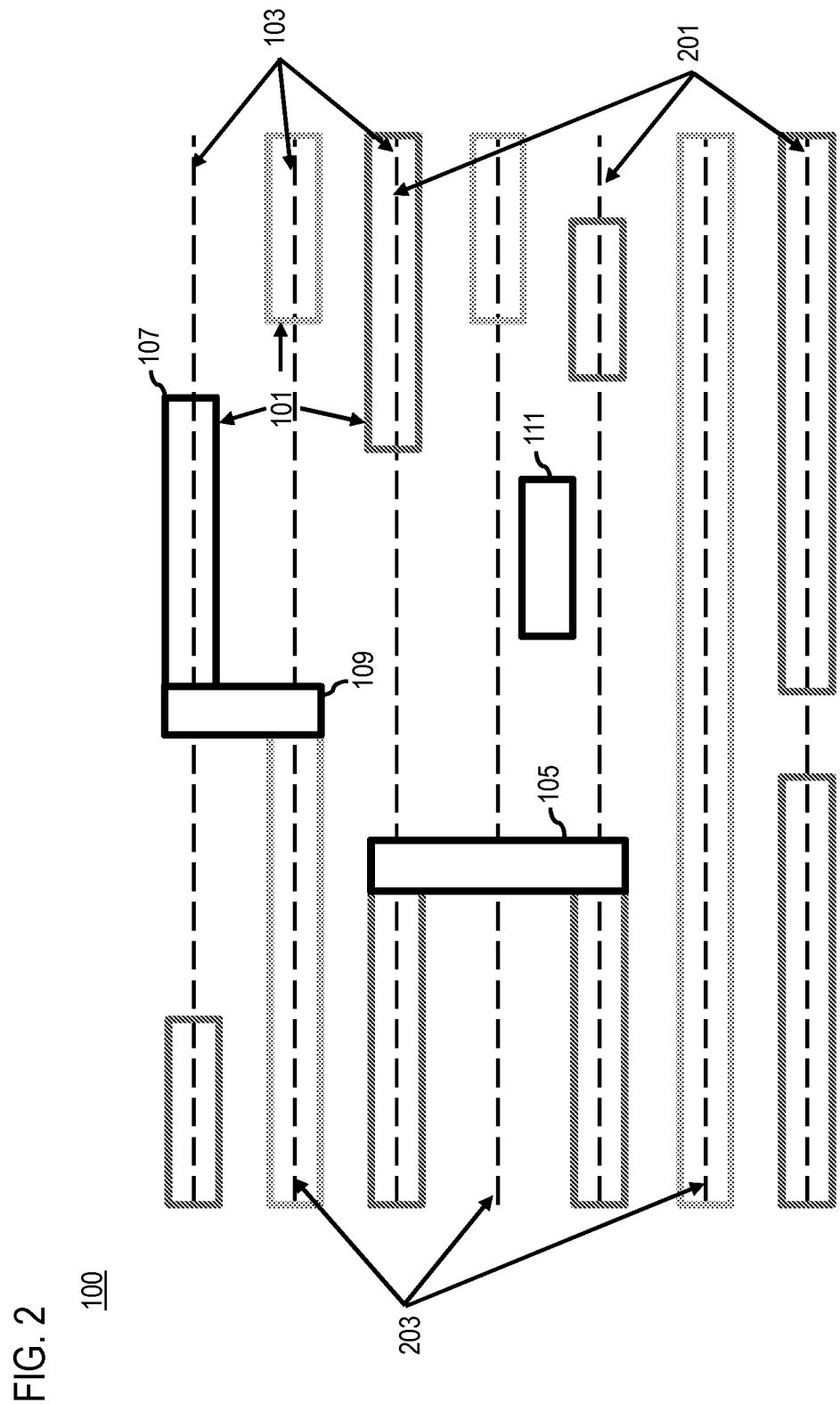

FIGS. 1 and 2 schematically illustrate a global coloring scheme, in accordance with an exemplary embodiment. Due to a complexity of color determination of SADP routes, global coloring schemes are often used to simplify route generation, where mandrel and non-mandrel colors are assigned to every other route track alternately. In many global coloring schemes, design decomposability can be assured if all routes exactly overlap with one route track. However, off-grid routes that are needed for route efficiency often render an IC design indecomposable using SADP processes.

Adverting to FIG. 1, routes 101 (e.g., polygons) are provided on a plurality of equally spaced vertical positions 103 of IC design 100. As shown routes 101 are designated to form an IC, for example, utilizing a SADP process. Additionally, jog route 105, short arm 107 of odd jog route 109, and off-grid structure 111 are provided in the IC design 100.

Adverting to FIG. 2, a global coloring scheme is used to bind a color to polygons according to vertical positions 103. For example, the vertical positions 103 are divided into alternating color tracks 201 and color tracks 203, and as such routes 101 overlapping only color tracks 201 are designated as a first color and routes 101 overlapping only color tracks 203 are designated as a second color. As shown, the first color indicates a mandrel metal and the second color indicates a non-mandrel metal. However, the jog route 105, short arm 107 of odd jog route 109, and off-grid structure 111 either (1) do not overlap tracks 201 and 203 or (2) overlap both tracks 201 and 203, and are thus color undeterminable.

Figure 3:
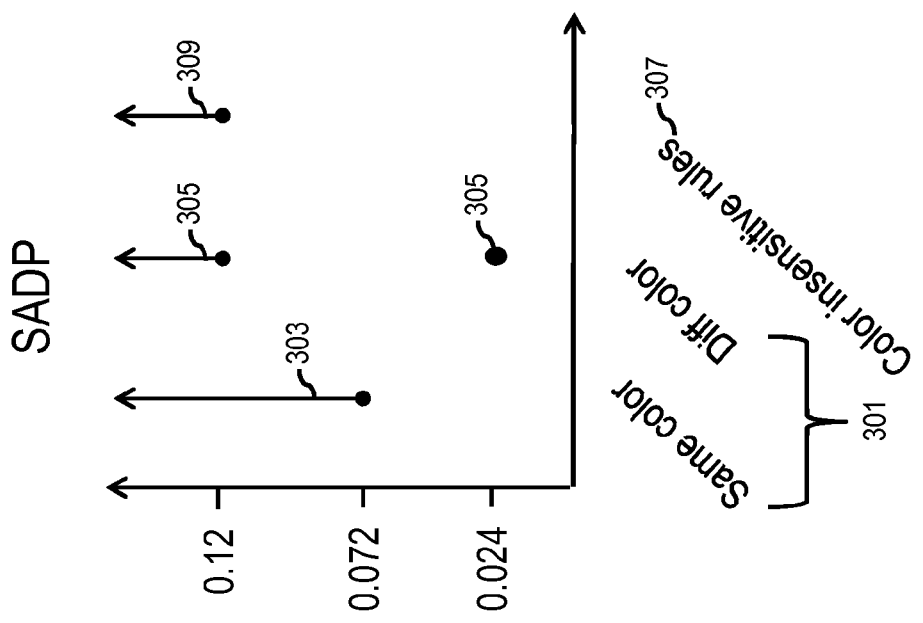
FIG. 3 illustrates color sensitive and color insensitive rules for an SADP process according to an exemplary embodiment.

FIG. 3 illustrates color sensitive and color insensitive rules for an SADP process, according to an exemplary embodiment. Adverting to FIG. 3, a first design rule 301 indicates a first separation distance 303 (e.g., 72 nm or greater) between routes of a same color and a second separation distance 305 (e.g., 24 nm or 120 nm or greater) between routes of different colors of a SADP process. As shown, a first color corresponds to routes designated to be decomposed using a mandrel region of an SADP process and a second color corresponds to routes designated to be decomposed using a non-mandrel region of the SADP process. Additionally, a second design rule 307 indicates a third separation distance 309 (e.g., 120 nm or greater) between routes of the same color and the same third separation distance between routes of different colors. As shown, the third separation distance 309 is greater than or equal to the first separation distance 303 and is greater than or equal to the second separation distance 305. As such, route polygons complying with color insensitive rule 307 will not impair a decomposability of a resulting IC design.

Figure 4:
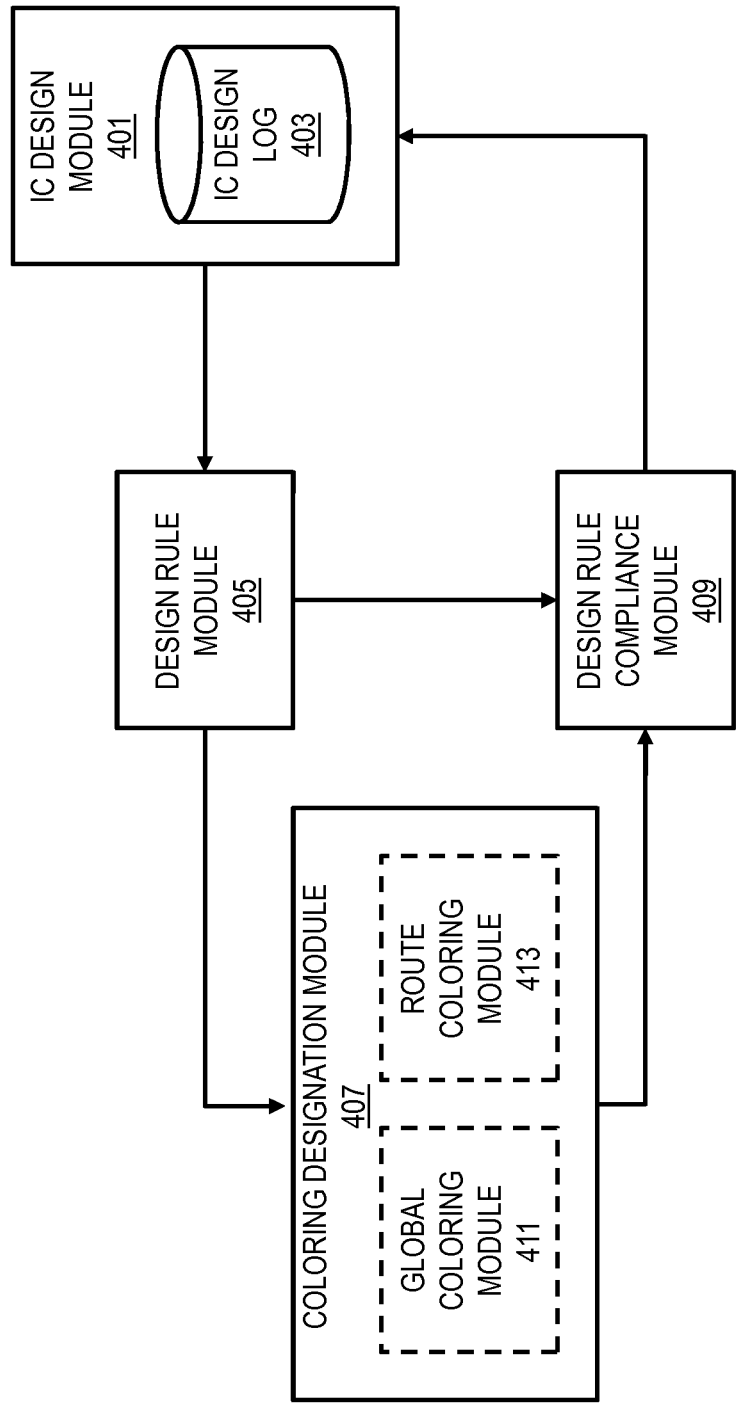
FIG. 4 illustrates a system enabling a generation of color undeterminable polygons in an IC design, according to an exemplary embodiment.

FIG. 4 illustrates a system enabling generation of color undeterminable polygons in an IC design. As shown, a system 400 includes an IC design module 401 having IC design log 403, a design rule module 405, a coloring designation module 407, and a design rule compliance module 409. The coloring designation module 407 may optionally include global and route coloring modules 411 and 413, respectively. Modules 401, 405, 407, and 409 may be combined.

IC design module 401 is configured to generate and/or facilitate a generation of an IC design stored in IC design log 403. In some instances the IC design module 401 is a commercial or proprietary software for generating IC designs, for instance, an electronic design automation (EDA) route tool. By way of example, the design module 401 generates polygons (e.g., routes) with separation from nearby polygons larger than a design rule selected by the design rule module 405.

Design rule module 405 is configured to select a design rule. In one embodiment, rule module 405 determines whether a route overlaps one vertical position of a plurality of equally spaced vertical positions. For instance, the rule module 405 selects a color sensitive rule (e.g., 301) for a route overlapping exactly one vertical position and a color insensitive rule (e.g., 307) for another route overlapping no or two or more vertical positions.

Coloring designation module 407 is configured to determine a color of a polygon (e.g., route) of an IC design from log 403. As shown, the coloring designation module 405 optionally includes global and route coloring modules 411 and 413, respectively. The coloring designation module 407 designates a color to polygons of an IC design of log 403. For instance, in IC designs utilizing an SADP process, a first color corresponds to routes designated to be decomposed using a mandrel region of an SADP process and a second color corresponds to routes designated to be decomposed using a non-mandrel region of the SADP process.

Global coloring module 411 is configured to bind a color to a route based on a track (e.g., vertical positions 103) the route overlaps. For instance, if a route overlaps only one track indicating a first color, then the global coloring module 411 binds the first color to the route. Similarly, if the route overlaps only one track indicating a second color, then the global coloring module 411 binds the second color to the route.

Route coloring module 413 is configured to bind a color to a route based design rules. For instance, if a route would be compliant with a design rule if bound to a first color and not a second color, then the route coloring module 413 would bind the route to the first color.

Design rule compliance module 409 is configured to ensure compliance of the IC design with the rules selected by rule module 405. For instance, routes having a designated or bound color are ensured to be separated from routes of the same color by a first distance and routes of another color by a second distance. Additionally, other routes (e.g., color undeterminable routes) may be ensured to be separated from other routes regardless of a color designation or binding.

Figure 5:
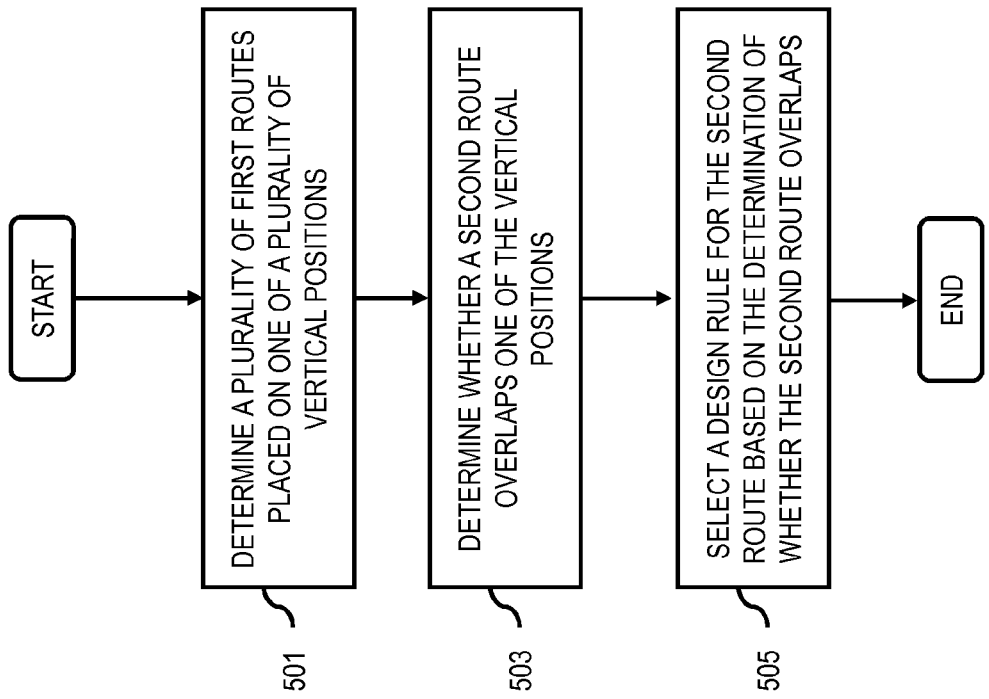
FIG. 5 is a flowchart of a process enabling a generation of color undeterminable polygons in an IC design, according to an exemplary embodiment.

FIG. 5 is a flowchart of a process for enabling generation of color undeterminable polygons in an IC design, according to an exemplary embodiment. For illustrative purposes, process 500 is described with respect to the system of FIG. 4 and illustrated in the steps of FIGS. 6 through 9. It is noted that the steps of process 500 may be performed in any suitable order, as well as combined or separated in any suitable manner.

Figure 6:
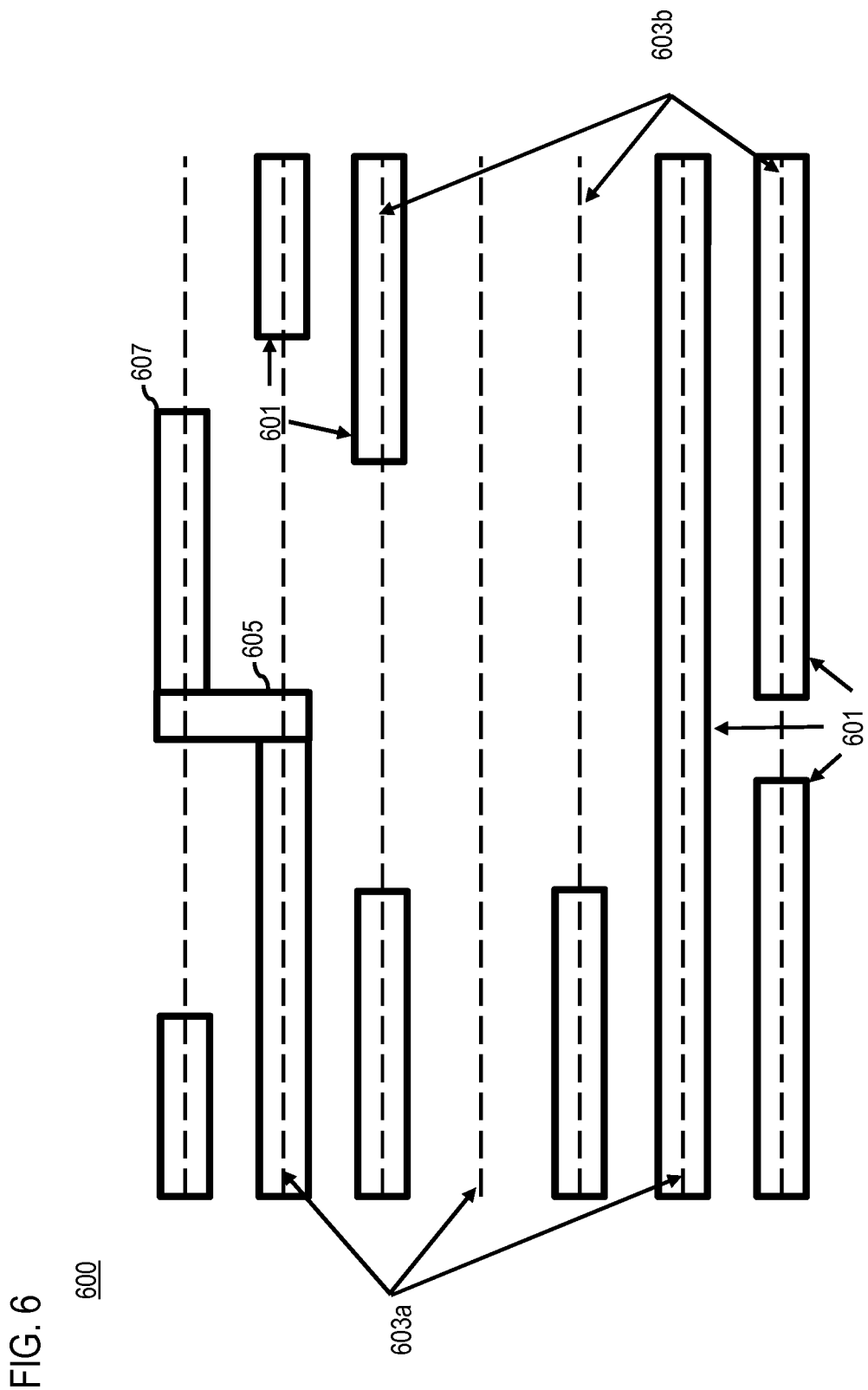
FIGS. 6 through 9 schematically illustrate a process enabling a generation of color undeterminable polygons in an IC design, in accordance with an exemplary embodiment.

Adverting to FIG. 6, an IC design 600 includes routes 601 (e.g., polygons) on a plurality of equally spaced vertical positions 603. As shown, the global coloring module 411 optionally designates first and second sets 603a and 603b, respectively, of the vertical positions 603 as first and second colors, respectively. Additionally, the IC design 600 may optionally include jog route 605, and short arm 607 of odd jog route 605. It is contemplated that the design module 401 may generate routes 601 according to a color sensitive rule (e.g., 301) and/or generate routes 605 and 607 according to a color insensitive rule (e.g., 307). In step 501, the IC design module 401 determines that each of the routes 601 is placed on one of the vertical positions 603. By way of example, the IC design module 401 determines an indication in log 403 of the routes 601 (or vertical positions 603) and determines the vertical positions 603 (or routes 601) based on the indication. Alternatively, the IC design module 401 determines an indication in log 403 of the routes 601 and the vertical positions 603.

Figure 7:
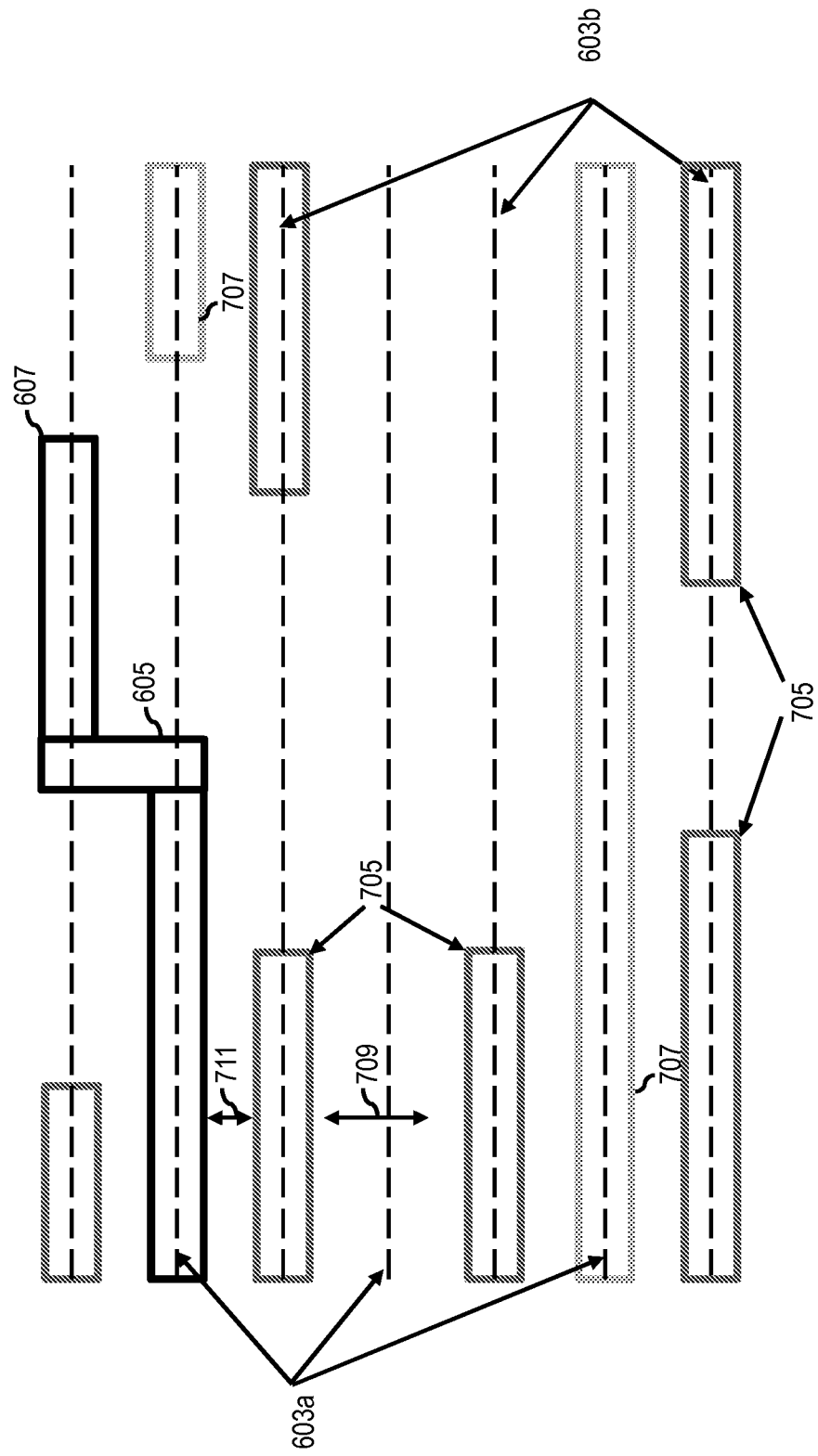
Figure 8:
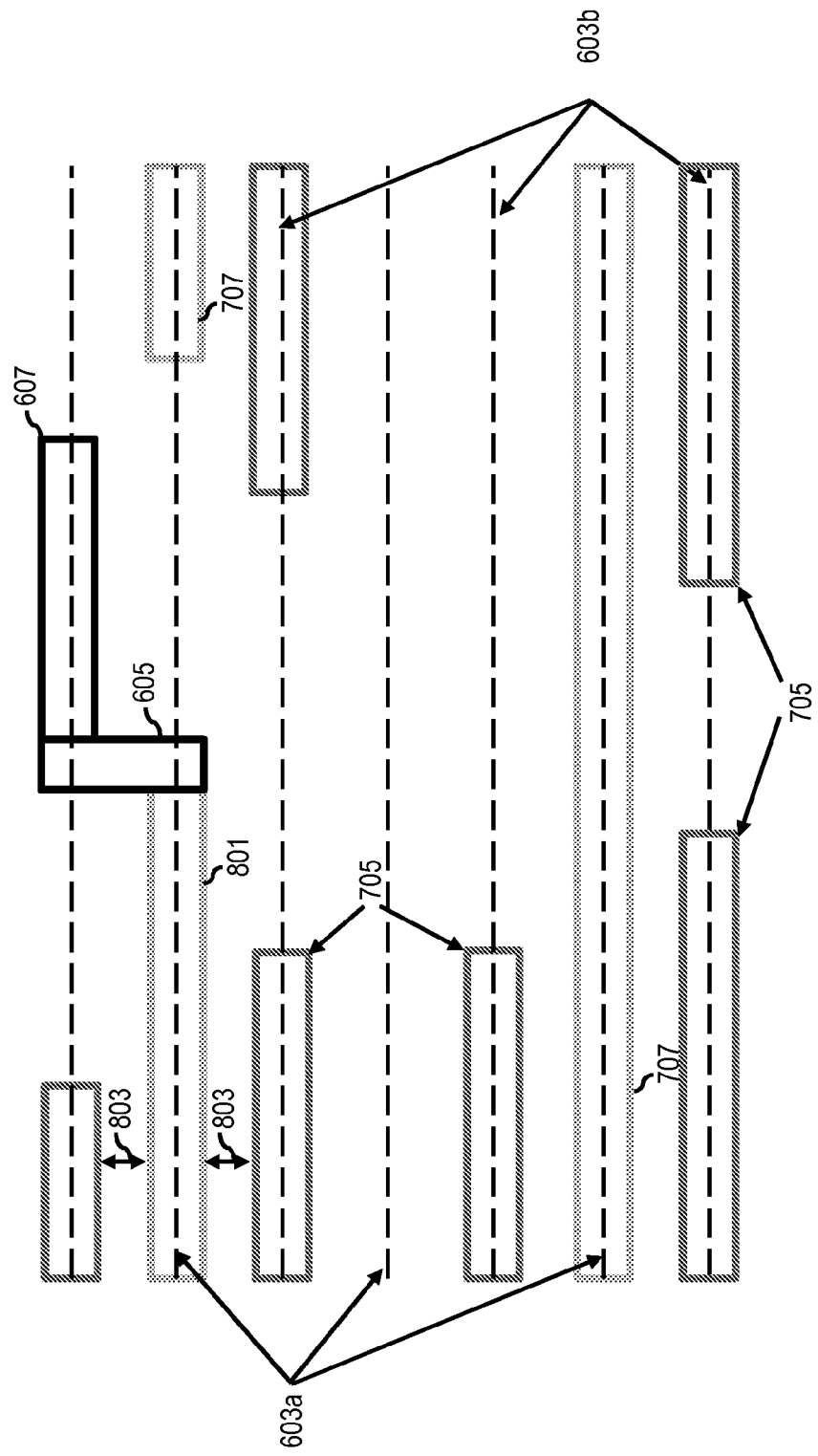

Adverting to FIG. 7, the global coloring module 411 optionally binds first and second colors to routes 705 and 707, respectively. As shown, the first rule indicates a first separation distance 709 between routes 705 and a second separation distance 711 between one of the routes 705 and one of the routes 707. Adverting to FIG. 8, the route coloring module 413 optionally binds route 801 as the first color, based on the separation distances 803 rendering the route 801 non-compliant in the second color.

Figure 9:
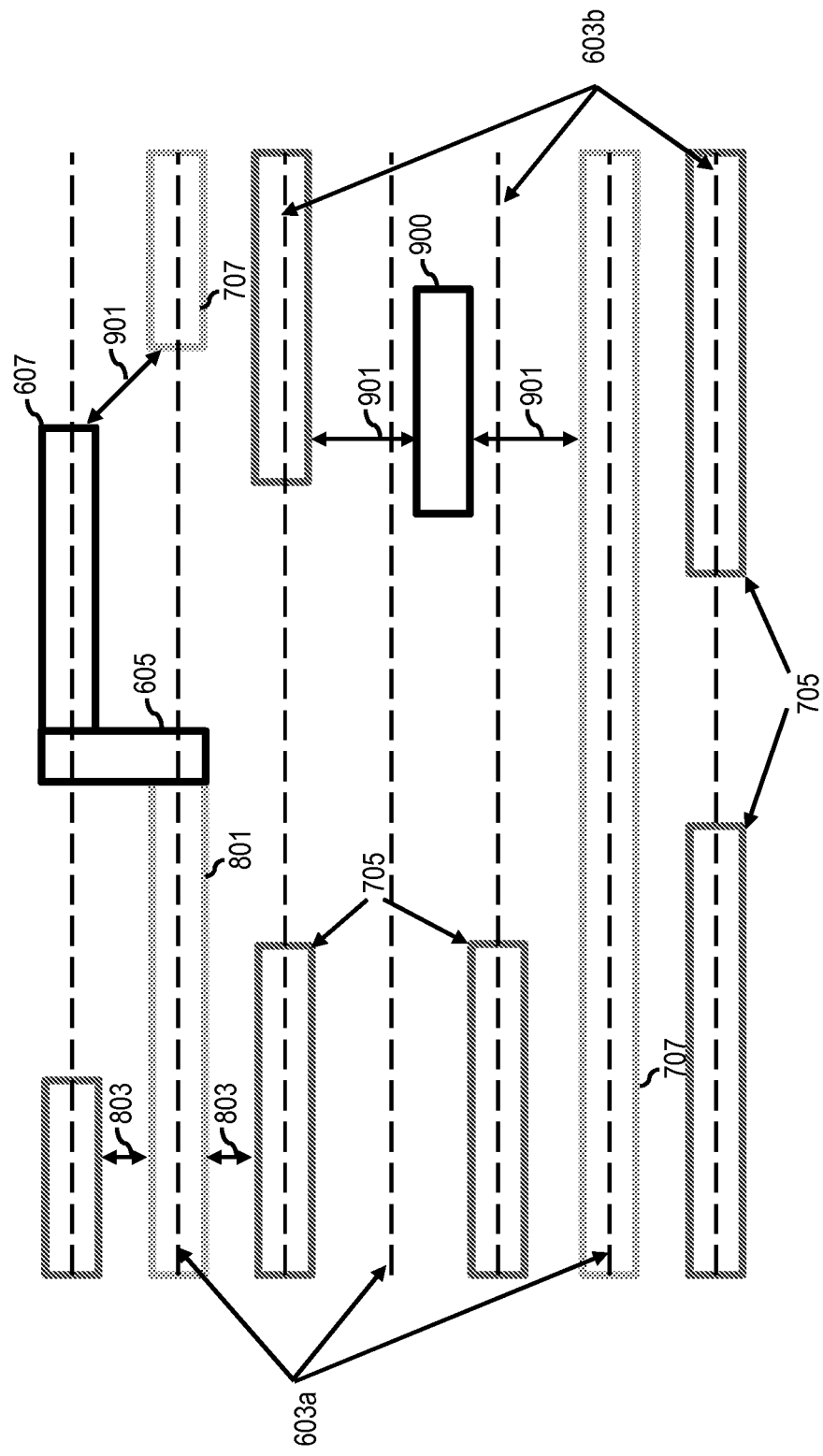

Adverting to FIG. 9, in step 503, the IC design module 401 determines whether the polygon 900 (e.g., route) overlaps one of the vertical positions 603. As shown, the polygon 900 does not overlap any of the vertical positions 603, and the rule module 405 accordingly, selects, as in step 505, a second rule (e.g., 307) for polygon 900. As shown, the second design rule indicates a third separation distance 901 between polygon 900 and routes 705, and the same third separation distance 901 between polygon 900 and routes 707. As such, the second rule is color-insensitive, thereby enabling the design module 401 to generate polygon 900 without first determining a color of the polygon 900.

Additionally, the compliance module 409 may optionally apply the first rule to the routes 705, 707, and 801 and apply the second rule to routes 605, 607, and polygon 900 to ensure compliance of the IC design with the rules selected by rule module 405. As such, a decomposability and manufacturability of IC designs may be ensured when color indeterminable routes (e.g., 605, 607 and 900) of the IC design comply with color insensitive design rules (e.g., 307).

Figure 10:
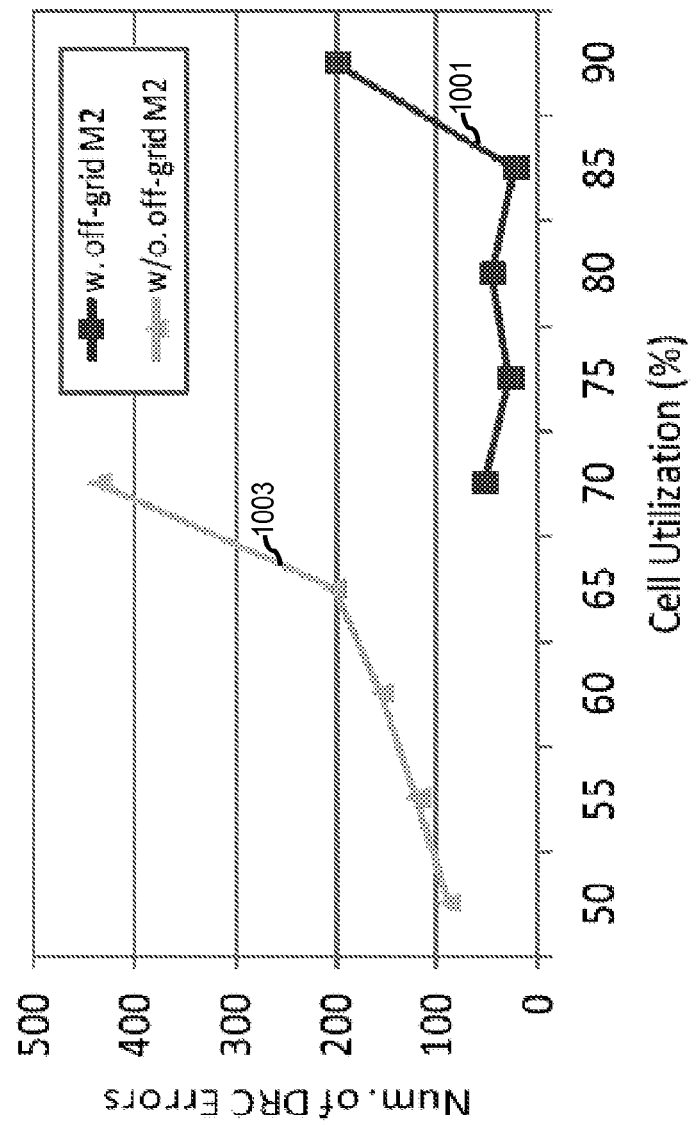
FIG. 10 illustrates experimental results with and without off-grid structures, according to an exemplary embodiment.

FIG. 10 illustrates experimental results 1001 of a first IC design with off-grid polygons (e.g., routes 605, 607, 900, etc.) and experimental results 1003 of a second IC design without off-grid polygons. As shown, results 1001 demonstrated a cell utilization improvement and a reduction in a number of design rule compliance errors (DRC) over results 1003. The embodiments illustrated in FIGS. 4 through 9 allow for use of off-grid polygons, thereby enabling the cell utilization improvement and a reduction in a number of DRC errors.

Figure 11:
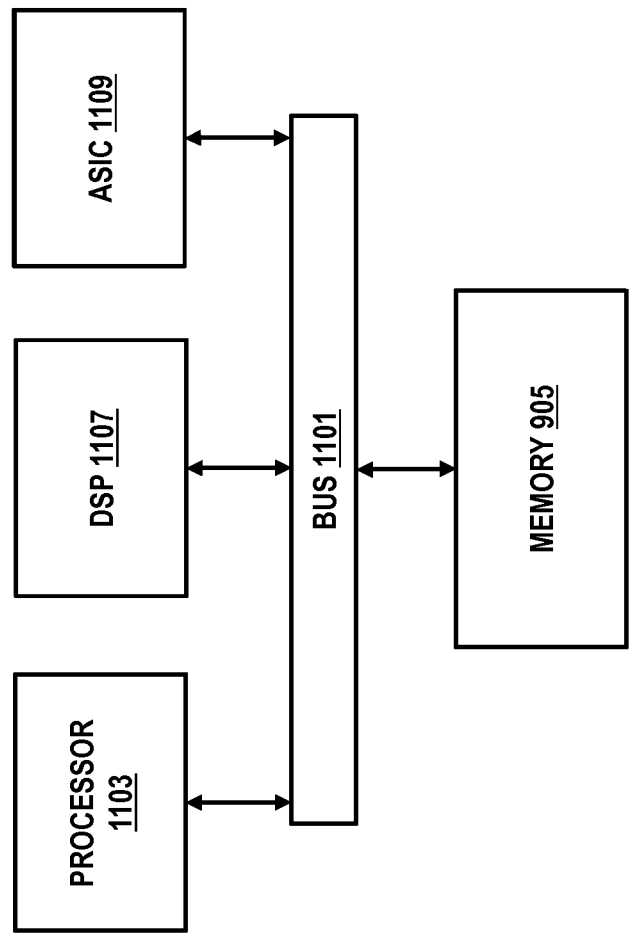
FIG. 11 illustrates a diagram of a chip set that can be used to implement exemplary embodiments.

FIG. 11 illustrates a diagram of a chip set that can be used to implement exemplary embodiments. Chip set 1100 is programmed to enable a generation of color undeterminable polygons in IC designs as described herein and includes, for instance, the processor and memory components described with respect to FIG. 11 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 1100, or a portion thereof, constitutes a means for performing one or more steps of FIGS. 6 through 9.

The chip set 1100 may include a communication mechanism such as a bus 1101 for passing information among the components of the chip set 1100. A processor 1103 has connectivity to the bus 1101 to execute instructions and process information stored in, for example, a memory 1105. The processor 1103 may include one or more processing cores with each core configured to perform independently. A multi-core processor enables multiprocessing within a single physical package. Examples of a multi-core processor include two, four, eight, or greater numbers of processing cores. Alternatively or in addition, the processor 1103 may include one or more microprocessors configured in tandem via the bus 1101 to enable independent execution of instructions, pipelining, and multithreading. The processor 1103 may also be accompanied by one or more specialized components to perform certain processing functions and tasks such as one or more digital signal processors (DSP) 1107, or one or more application-specific integrated circuits (ASIC) 1109. A DSP 1107 typically is configured to process real-world signals (e.g., sound) in real time independently of the processor 1103. Similarly, an ASIC 1109 can be configured to performed specialized functions not easily performed by a general purpose processor. Other specialized components to aid in performing the inventive functions described herein include one or more field programmable gate arrays (FPGA) (not shown), one or more controllers (not shown), or one or more other special-purpose computer chips.

The processor 1103 and accompanying components have connectivity to the memory 1105 via the bus 1101. The memory 1105 includes both dynamic memory (e.g., RAM, magnetic disk, writable optical disk, etc.) and static memory (e.g., ROM, CD-ROM, etc.) for storing executable instructions that when executed perform the inventive steps described herein. The memory 1105 also stores the data associated with or generated by the execution of the inventive steps.

The embodiments of the present disclosure can achieve several technical effects, including an improvement in a density of features (e.g., cell utilization) of an IC and/or a manufacturing yield of an IC. The present disclosure enjoys industrial applicability in any of various types of highly integrated semiconductor devices, particularly large IC designs utilizing off-grid polygons, particularly for the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
designating each of a plurality of first routes extending horizontally in an integrated circuit (IC) design positions as one of a plurality of colors, each of the plurality of first routes being placed on one of a plurality of equally spaced vertical positions of the IC design, wherein each of the first routes is generated according to a first design rule indicating a first separation distance between routes designated as different colors and a second separation distance between routes designated as same colors;
designating a second route as color insensitive based on whether the second route overlaps one of the vertical positions of the plurality of equally spaced vertical positions;
generating the second route according to a second design rule indicating a third separation distance between the second route and each route of the plurality of first routes without regard to a color designation; and
fabricating a semiconductor device comprising an integrated circuit containing the generated first and second routes.

2. The method according to claim 1, further comprising:
designating first and second sets of the equally spaced vertical positions, each vertical position of the first set of the equally spaced vertical positions being separated from another vertical position of the first set of the equally spaced vertical positions by a vertical position of the second set of the equally spaced vertical positions, wherein the designation of each of the plurality of first routes is based on the designation of the first and second sets of the equally spaced vertical positions.

3. The method according to claim 1, wherein the third separation distance is greater than or equal to the first separation distance and is greater than or equal to the second separation distance.

4. The method according to claim 1, wherein each of the plurality of first routes is designated as a first or second color, the method further comprising:

designating routes of the first and second colors to be decomposable using mandrel and non-mandrel regions, respectively; and designating the second route to be decomposable using either the mandrel or the non-mandrel region.

5. The method according to claim 1, wherein the second route is designated as color insensitive if the second route overlaps one of the vertical positions of the plurality of equally spaced vertical positions.

6. The method according to claim 1, wherein the first routes and the second route are metal routes.

7. The method according to claim 1, wherein the IC design utilizes a self-aligned double patterning (SADP) process.

8. An apparatus comprising:

at least one processor; and at least one memory, including computer program code for a program, the at least one memory and the computer program code configured to, with the at least one processor, cause the apparatus to perform the following:

designate each of a plurality of first routes extending horizontally in an integrated circuit (IC) design positions as one of a plurality of colors, each of the plurality of first routes being placed on one of a plurality of equally spaced vertical positions of the IC design, wherein each of the first routes is generated according to a first design rule indicating a first separation distance between routes designated as different colors and a second separation distance between routes designated as same colors;

designate a second route as color insensitive based on whether the second route overlaps one of the vertical positions of the plurality of equally spaced vertical positions;

generate the second route according to a second design rule indicating a third separation distance between the second route and each route of the plurality of first routes without regard to a color designation; and fabricate a semiconductor device comprising an integrated circuit containing the generated first and second routes.

9. The apparatus according to claim 8, wherein the apparatus is further configured to:

designate first and second sets of the equally spaced vertical positions, each vertical position of the first set of the equally spaced vertical positions being separated from another vertical position of the first set of the equally spaced vertical positions by a vertical position of the second set of the equally spaced vertical positions, wherein the designation of each of the plurality of first routes is based on the designation of the first and second sets of the equally spaced vertical positions.

10. The apparatus according to claim 8, wherein the third separation distance is greater than or equal to the first separation distance and is greater than or equal to the second separation distance.

11. The apparatus according to claim 8, wherein each of the plurality of first routes is designated as a first or second color, the apparatus further configured to:

designate routes of the first and second colors to be decomposable using mandrel and non-mandrel regions, respectively; and designate the second route to be decomposable using either the mandrel or the non-mandrel region.

12. The apparatus according to claim 8, wherein the second route is designated as color insensitive if the second route overlaps one of the vertical positions of the plurality of equally spaced vertical positions.

13. The apparatus according to claim 8, wherein the first routes and the second route are metal routes.

14. The apparatus according to claim 8, wherein the IC design utilizes a self-aligned double patterning (SADP) process.

\* \* \* \* \*